US008039848B2

(12) United States Patent
Loh et al.

(10) Patent No.: US 8,039,848 B2
(45) Date of Patent: Oct. 18, 2011

(54) SEMICONDUCTOR LIGHT EMITTING DEVICE SUBSTRATE STRIPS AND PACKAGED SEMICONDUCTOR LIGHT EMITTING DEVICES

(75) Inventors: Ban P. Loh, Durham, NC (US); Nicholas W. Medendorp, Jr., Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/835,013

(22) Filed: Jul. 13, 2010

(65) Prior Publication Data
US 2010/0276708 A1 Nov. 4, 2010

Related U.S. Application Data

(63) Continuation of application No. 11/507,191, filed on Aug. 21, 2006, now Pat. No. 7,763,478.

(51) Int. Cl.
H01L 27/15 (2006.01)
H01L 31/12 (2006.01)
H01L 33/00 (2010.01)

(52) U.S. Cl. ............ 257/81; 257/98; 257/E33.001; 257/E33.061

(58) Field of Classification Search .......... 257/79, 257/81, 98, 99, E33.001, E33.061
See application file for complete search history.

(56) References Cited

U.S. PATENT DOCUMENTS

| 4,918,497 A | 4/1990 | Edmond | 357/17 |
|---|---|---|---|
| 4,966,862 A | 10/1990 | Edmond | 437/100 |
| 5,027,168 A | 6/1991 | Edmond | 357/17 |
| 5,210,051 A | 5/1993 | Carter, Jr. | 437/107 |
| 5,277,840 A | 1/1994 | Osaka et al. | 252/301.36 |
| 5,338,944 A | 8/1994 | Edmond et al. | 257/76 |
| 5,393,993 A | 2/1995 | Edmond et al. | 257/77 |
| 5,416,342 A | 5/1995 | Edmond et al. | 257/76 |
| 5,523,589 A | 6/1996 | Edmond et al. | 257/77 |
| 5,604,135 A | 2/1997 | Edmond et al. | 437/22 |
| 5,631,190 A | 5/1997 | Negley | 438/33 |
| 5,739,554 A | 4/1998 | Edmond et al. | 257/103 |
| 5,813,753 A | 9/1998 | Vriens et al. | 362/293 |
| 5,858,278 A | 1/1999 | Itoh et al. | 252/301.4 |
| 5,912,477 A | 6/1999 | Negley | 257/95 |
| 5,959,316 A | 9/1999 | Lowery | 257/98 |
| 5,998,925 A | 12/1999 | Shimizu et al. | |

(Continued)

FOREIGN PATENT DOCUMENTS

CN 1773738 A 5/2006

(Continued)

OTHER PUBLICATIONS

U.S. Appl. No. 11/751,990, filed May 22, 2007, Negley.

(Continued)

Primary Examiner — Hoai V Pham
(74) Attorney, Agent, or Firm — Myers Bigel Sibley & Sajovec, PA (57) ABSTRACT

Semiconductor light emitting device packaging methods include fabricating a substrate configured to mount a semiconductor light emitting device thereon. The substrate may include a cavity configured to mount the semiconductor light emitting device therein. The semiconductor light emitting device is mounted on the substrate and electrically connected to a contact portion of the substrate. The substrate is liquid injection molded to form an optical element bonded to the substrate over the semiconductor light emitting device. Liquid injection molding may be preceded by applying a soft resin on the electrically connected semiconductor light emitting device in the cavity. Semiconductor light emitting device substrate strips are also provided.

12 Claims, 8 Drawing Sheets

U.S. PATENT DOCUMENTS

| | | | |
|---|---|---|---|
| 6,069,440 A | 5/2000 | Shimizu et al. | 313/486 |
| 6,120,600 A | 9/2000 | Edmond et al. | 117/89 |
| 6,187,606 B1 | 2/2001 | Edmond et al. | 438/46 |
| 6,201,262 B1 | 3/2001 | Edmond et al. | 257/77 |
| 6,204,523 B1 | 3/2001 | Carey et al. | |
| 6,252,254 B1 | 6/2001 | Soules et al. | 257/89 |
| 6,274,924 B1 | 8/2001 | Carey et al. | 257/676 |
| 6,518,600 B1 | 2/2003 | Shaddock | |
| 6,521,916 B2 | 2/2003 | Roberts et al. | |
| 6,635,363 B1 | 10/2003 | Duclos et al. | 428/690 |
| 6,747,406 B1 | 6/2004 | Bortscheller et al. | 313/512 |
| 7,126,274 B2 | 10/2006 | Shimizu et al. | |
| 7,215,074 B2 | 5/2007 | Shimizu et al. | |
| 7,355,284 B2 | 4/2008 | Negley | |
| 2001/0042865 A1* | 11/2001 | Oshio et al. | 257/100 |
| 2002/0123164 A1 | 9/2002 | Slater, Jr. et al. | 438/39 |
| 2003/0006418 A1 | 1/2003 | Emerson et al. | 257/79 |
| 2003/0168670 A1 | 9/2003 | Roberts et al. | |
| 2004/0041222 A1 | 3/2004 | Loh | 257/433 |
| 2004/0056260 A1 | 3/2004 | Slater, Jr. et al. | 257/79 |
| 2006/0103302 A1 | 5/2006 | Tanaka et al. | |
| 2008/0017875 A1 | 1/2008 | Lee et al. | |

FOREIGN PATENT DOCUMENTS

| | | |
|---|---|---|
| JP | 54-19660 | 2/1979 |
| JP | 2521021 | 10/1996 |
| JP | 2005-116817 | 4/2005 |
| JP | 2005-277380 | 10/2005 |
| JP | 2005-537655 | 12/2005 |
| JP | 2006-148147 | 6/2006 |
| JP | 2006-173561 | 6/2006 |
| WO | WO 2004021459 | 3/2004 |

OTHER PUBLICATIONS

International Search Report and Written Opinion (9 pages) corresponding to International Application No. PCT/US07/12158; Mailing Date: May 2, 2008.

International Search Report and Written Opinion (6 pages) corresponding to International Application No. PCT/US07/12158; Mailing Date: Jun. 9, 2008.

Notification of Transmittal of International Preliminary Report on Patentability (11 pages) corresponding to International Application No. PCT/US07/12158; Mailing Date: Nov. 3, 2008.

Notice of Office Action issued Sep. 7, 2010 during examination of the corresponding Chinese patent application No. 200710142646.3 (10 pages).

Official Action corresponding to Japanese Patent Application No. 2007-214709; Dispatch date Mar. 4, 2011; 16 pages.

* cited by examiner

SEMICONDUCTOR LIGHT EMITTING DEVICE SUBSTRATE STRIPS AND PACKAGED SEMICONDUCTOR LIGHT EMITTING DEVICES

RELATED APPLICATION(S)

The present application is a continuation application of and claims priority from U.S. patent application Ser. No. 11/507,191, filed Aug. 21, 2006 now U.S. Pat. No. 7,763,478, the disclosure of which is hereby incorporated herein by reference in its entirety.

BACKGROUND OF THE INVENTION

This invention relates to semiconductor light emitting devices and manufacturing methods therefor, and more particularly to packaging and packaging methods for semiconductor light emitting devices.

Semiconductor light emitting devices, such as Light Emitting Diodes (LEDs) or laser diodes, are widely used for many applications. As is well known to those having skill in the art, a semiconductor light emitting device includes one or more semiconductor layers that are configured to emit coherent and/or incoherent light upon energization thereof. It is also known that the semiconductor light emitting device generally is packaged to provide external electrical connections, heat sinking, lenses or waveguides, environmental protection and/or other functions.

For example, it is known to provide a two-piece package for a semiconductor light emitting device, wherein the semiconductor light emitting device is mounted on a substrate that comprises alumina, aluminum nitride and/or other materials, which include electrical traces thereon, to provide external connections for the semiconductor light emitting device. A second substrate, which may comprise silver plated copper, is mounted on the first substrate, for example, using glue, surrounding the semiconductor light emitting device. A lens may be placed on the second substrate over the semiconductor light emitting device. Light emitting diodes with two-piece packages as described above are described in Application Serial No. US 2004/0041222 A1 to Loh, entitled Power Surface Mount Light Emitting Die Package, published Mar. 4, 2004, assigned to the assignee of the present invention, the disclosure of which is hereby incorporated herein by reference in its entirety as if set forth fully herein.

With multipart mounting packages for semiconductor light emitting devices, the different parts are typically made of different materials. As a result, the thermal impedance for such packages may be higher and a thermal mismatch may result among the various components within a package that may cause reliability problems with a package. For example, problems may result at an interface between a copper metal of a heat sink or cavity with a plastic of a body in which such a heat sink or cavity is mounted. In addition, assembly may be more complicated because of increased piece part counts for the package. In addition, where a sheet metal optical cavity is utilized, a cavity typically can only be fabricated in a limited range of depth and shape configurations. Such multipart packages may also have a larger optical cavity space, resulting in greater volumes of encapsulant being used, which may increase problems related to delamination and/or formation of bubbles within the encapsulant during temperature cycles.

For known power light emitting device packages, a relatively small heat-slug is typically utilized, which may be portion of the associated electrical leads or an isolated piece. A molded plastic body typically occupies a major part of the package and wraps around the heat spreading component. A lens may be mounted on top of the plastic body and surrounding an optical cavity and an encapsulant material may be used to fill the cavity, which may be hard epoxy or may be soft gel. An example of a prior art power light emitting device package is available from Lumileds Lighting, LLC of San Jose, Calif. as described in U.S. Pat. No. 6,274,924. As described in the '924 patent, a molded plastic body, which occupies a major bulk of the package, wraps around a relatively small, isolated heat-slug on which an LED chip or chips may be mounted. A plastic lens may be locked onto the plastic body, for example, using an adhesive, to form a closed space in the heat-slug and a portion of the plastic body. The enclosed space may be filled with a soft gel that may move in and out of the enclosed space through vents with temperature change. Such a product may not be surface mount technology (SMT) compatible, as its packaging materials generally cannot withstand solder reflow temperatures. In addition, during use, the soft encapsulant may tend to form bubbles or delaminate from the enclosure walls, which may adversely affect device reliability. It is also known to form the lens using a dispensing method capitalizing on the viscosity of a resin used in forming the lens.

The use of a pre-molded lens attached by adhesive may encounter some problems in robustness and reliability of the finished product. For example, the manufacturing process for such devices may be inherently inconsistent and the resultant package may be less robust and/or reliable.

It is also known to use transfer molding of epoxy to encapsulate certain low power LED packages, such as miniature surface mountable devices available from Hewlett Packard Corporation. The epoxy on such devices may provide the structural strength to the package as well as encapsulating the devices inside. However, epoxy tends to be degraded by the electromagnetic energy of blue light, generally generated by some semiconductor light emitting devices, and may become less transmissive to light as a result. The resulting package may, therefore, become dimmer over a relatively short period of time. As such, epoxy may be a less attractive option for encapsulating devices that emit blue light. In addition, epoxy generally has a Coefficient of Thermal Expansion (CTE) mismatch problem with silicone soft gel, which may be used to junction coat the LED chips and their bond wires as the first layer of encapsulant.

It is also known to use casting to encapsulate LED devices with epoxy. This process typically can only be applied to an open chamber, where curing may occur with the epoxy contained in a cup and a lead frame may be inserted inside the cup and be casted when the epoxy is cured. During curing, a level of liquid epoxy is generally free to adjust itself as a result of chemical reactions and shrinkage in volume.

SUMMARY OF THE INVENTION

Some embodiments of the present invention provide semiconductor light emitting device packaging methods include fabricating a substrate configured to mount a semiconductor light emitting device thereon. The substrate may include a cavity configured to mount the semiconductor light emitting device therein. The semiconductor light emitting device is mounted on the substrate and electrically connected to a contact portion of the substrate. The substrate is liquid injection molded to form an optical element bonded to the substrate over the semiconductor light emitting device. Liquid injection molding may be preceded by applying a soft resin on the electrically connected semiconductor light emitting device in the cavity.

In further embodiments, fabricating the substrate includes forming a metal base structure. The metal base structure is overmolded with a high temperature plastic material. The high temperature plastic material is a harder material than a material used for liquid injection molding the substrate to form the optical element and has a lower optical transmissivity than the material used for liquid injection molding the substrate to form the optical element. The high temperature plastic material may include a reflective material additive. The high temperature plastic material may be a polyphthalamide (PPA) and/or a liquid crystal polymer (LCP) and the reflective material additive may be glass, titanium dioxide ($TiO_2$) and/or barium sulfate ($BaSO_4$).

In other embodiments, electrically connecting the semiconductor light emitting device includes wirebonding the semiconductor light emitting device to the contact portion with a bond wire. Applying a soft resin may include covering the semiconductor light emitting device and the bond wire with the soft resin.

In further embodiments, liquid injection molding includes placing the substrate in a mold having a mold cavity having a shape that defines the optical element. Resin is injected into the mold. The injected resin is cured to form the optical element bonded to the substrate. The resin may be a thermoset resin and injecting the resin into the mold may be preceded by metering and mixing a hardener into the resin. Injecting the resin may include dispensing the resin into a receiving chamber of the mold and activating an injection plunger to move the resin from the receiving chamber into the mold cavity while removing substantially all air from the mold cavity to limit formation of air pockets in the optical element.

In further embodiments, the substrate is a substrate strip including a plurality of substrates and the mold includes a plurality of cavities that define the optical element for respective ones of the substrates. The mold may be configured to receive a plurality of the substrate strips and placing the substrate may include placing the plurality of substrate strips in the mold.

In yet other embodiments, fabricating the substrate includes forming a metal base structure defining resin bonding surfaces. The metal base structure is overmolded with a high temperature plastic material to define the plurality of substrates and to define a passageway that directs flow of the resin between the respective plurality of substrates and into the plurality of cavities during injection of the resin. Injecting resin into the mold includes flowing the resin through the passageway and into contact with the high temperature plastic material on the resin bonding surfaces. The high temperature plastic material may be a higher durometer material than the injected resin and may have a lower optical transmissivity than the injected resin. The high temperature plastic material may be a polyphthalamide (PPA) and/or a liquid crystal polymer (LCP) and the injected resin may be a thermoset resin.

In further embodiments, liquid injection molding is preceded by applying a soft resin on the electrically connected semiconductor light emitting device in the cavity. The soft resin may be silicone. The injected resin may be a higher durometer material and have a refractive index substantially similar to a refractive index of the soft resin to limit total internal reflection of the semiconductor light emitting device and may have a coefficient of thermal expansion substantially similar to a coefficient of thermal expansion of the soft resin. Electrically connecting the semiconductor light emitting device may include wirebonding the semiconductor light emitting device to the contact portion with a bond wire and applying a soft resin may include covering the semiconductor light emitting device and the bond wire with the soft resin.

In other embodiments, injecting resin into the mold includes injecting the resin at a selected injection pressure and injection speed and curing the injected resin includes curing the injected resin at a selected temperature and holding pressure for a selected time. The injected resin may be a higher durometer material and have a refractive index substantially similar to a refractive index of the soft resin to limit total internal reflection of the semiconductor light emitting device and may have a coefficient of thermal expansion substantially similar to a coefficient of thermal expansion of the soft resin.

In yet further embodiments, semiconductor light emitting device substrate strips include a metal base structure. A plurality of high temperature plastic material substrates are on the metal base structure. The substrates include semiconductor light emitting device receiving cavities. A passageway extends between the receiving cavities configured to direct a flow of resin between the respective receiving chambers. The high temperature plastic material may include a reflective material additive. The high temperature plastic material may be a polyphthalamide (PPA) and/or a liquid crystal polymer (LCP) and the reflective material additive may be titanium dioxide ($TiO_2$) and/or barium sulfate ($BaSO_4$).

In other embodiments, the substrate strip further includes a semiconductor light emitting device positioned in each of the receiving cavities. A lens material covers each of the receiving cavities. The lens material defines an optical element and includes a residual resin portion extending through the passageway of the substrate strip. The semiconductor light emitting devices may be electrically connected to leads defined by the metal base structure that extend through the substrates to the receiving cavities. The light emitting devices may be electrically connected by bond wires and the substrate strip may further include a soft resin between the semiconductor light emitting devices and the bond wires and the lens material.

DETAILED DESCRIPTION OF EMBODIMENTS OF THE INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 1:
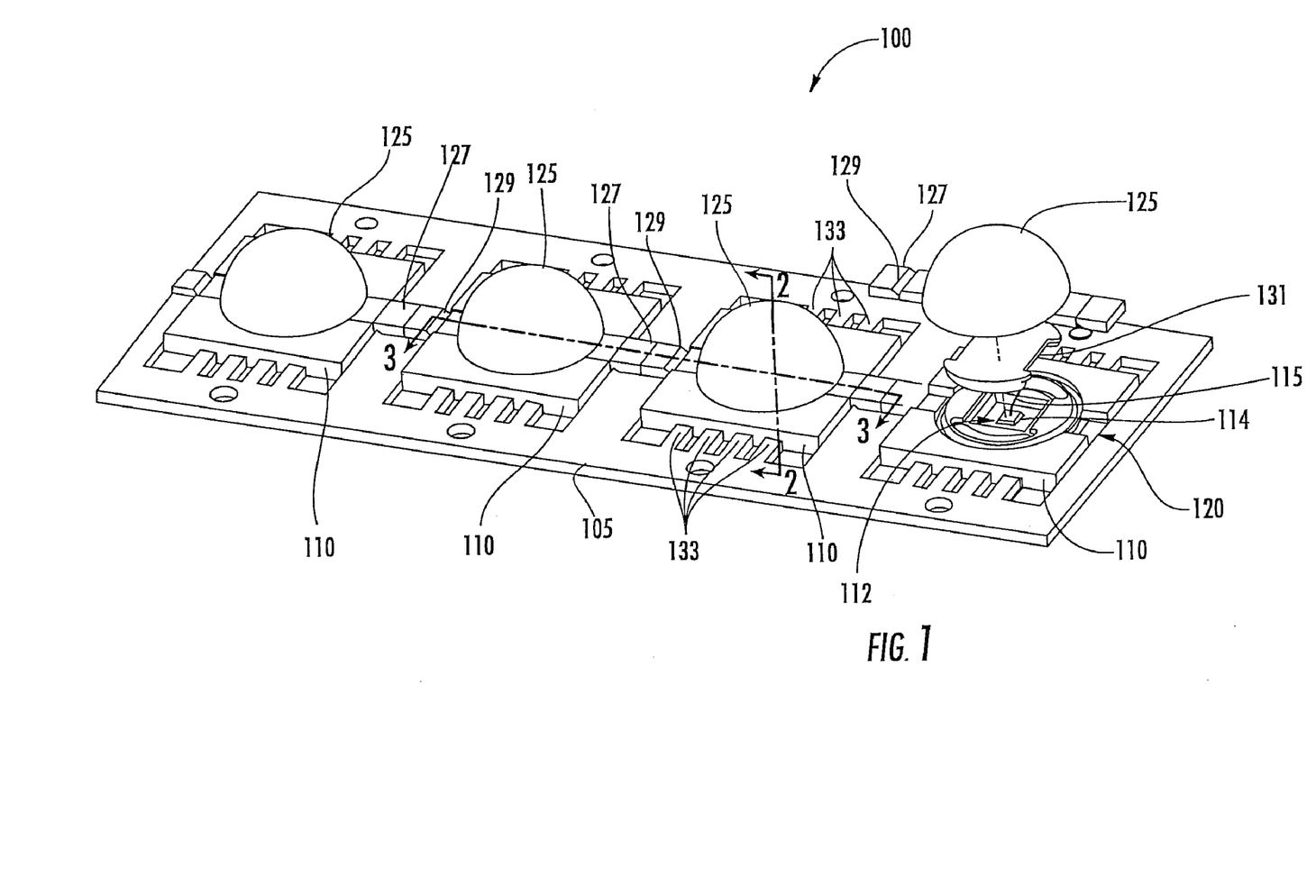
FIG. 1 is a partially exploded perspective view of a semiconductor light emitting device substrate strip according to various embodiments of the present invention.
Figure 2:
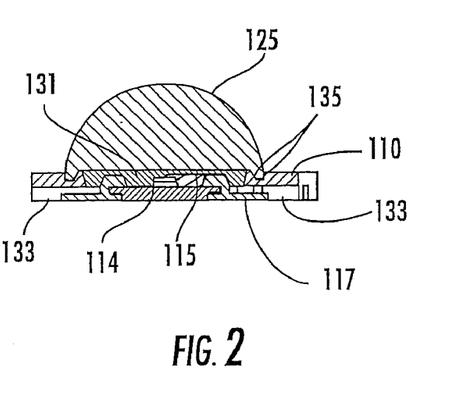
FIG. 2 is a cross sectional view of the substrate strip of FIG. 1 taken along line 2-2 of FIG. 1.
Figure 3:
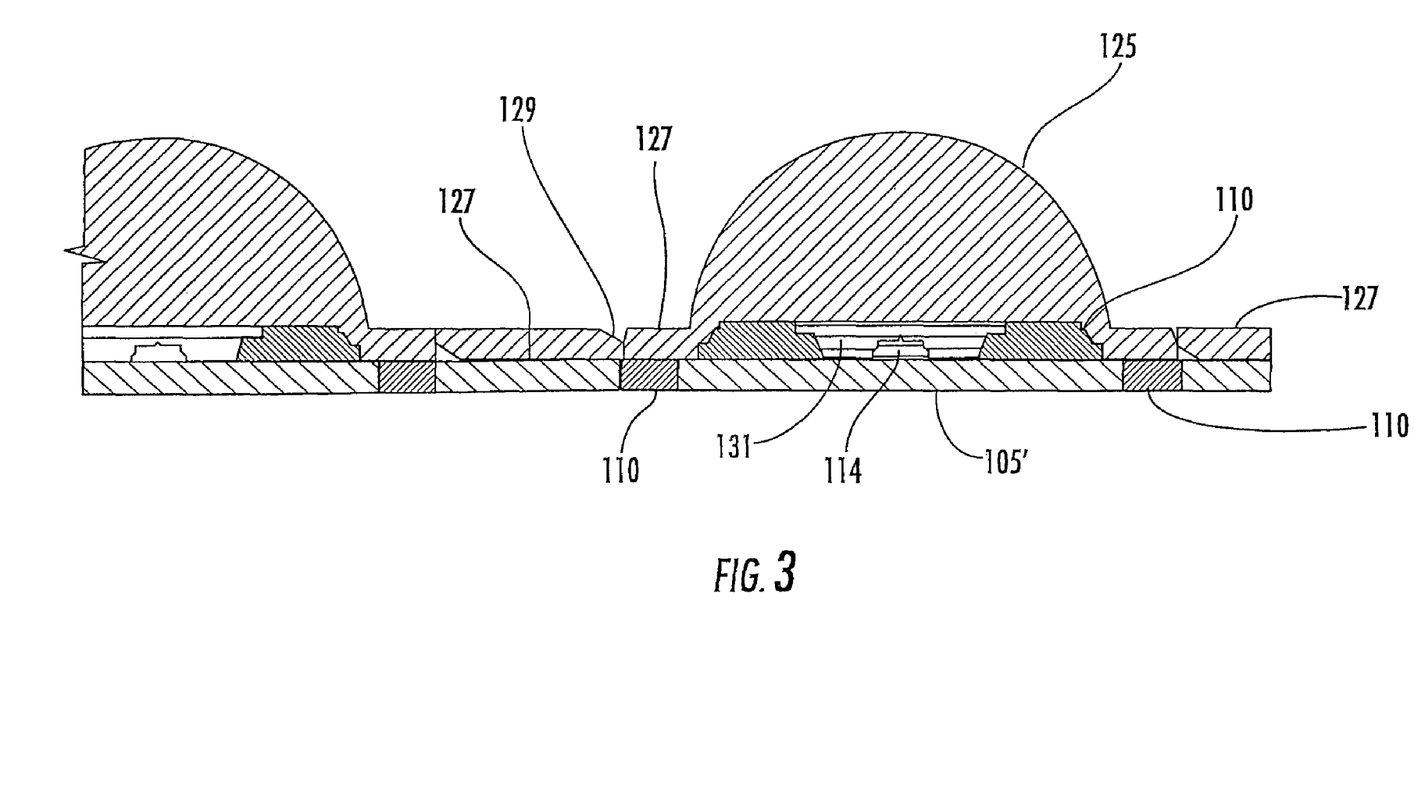
FIG. 3 is a cross sectional view of the substrate strip of FIG. 1 taken along line 3-3 of FIG. 1.

Embodiments of packaged semiconductor light emitting devices and substrate strips including the same and methods for forming the same will now be described with reference to FIGS. 1-9. In particular, a substrate member in the form of a substrate strip 100 according to some embodiments of the present invention will be described with reference to FIGS. 1-3. FIG. 1 is a partially exploded perspective view of a semiconductor light emitting device substrate strip according to some embodiments of the present invention. FIG. 2 is a cross sectional view of the substrate strip of FIG. 1 taken along the line 2-2 in FIG. 1. FIG. 3 is a cross sectional view of the substrate strip of FIG. 1 taken along line 3-3 of FIG. 1.

As illustrated in FIGS. 1-3, the substrate strip 100 includes a metal base structure shown as a lead frame 105 in FIGS. 1-3. A plurality of high temperature plastic material substrates 110 are shown on the lead frame 105. The lead frame 105 may be made from a sheet metal, such as copper, by, for example, stamping and/or etching. The substrates 110 may be formed of a high temperature plastic material which is over-molded to the lead frame 105. The lead frame 105 and over-molded substrates 110 may be selected to provide rigidity so that they may withstand handling, and may provide protection for light emitting devices included therein during assembly operation, such as die-attach and wirebonding.

Plastic materials selected for the substrates 110 may also be selected to have added optical properties, such as reflectivity. The reflectivity may be provided, for example, by adding refined particles of reflective materials. For example, in some embodiments, the substrates 110 are a high temperature plastic material, such as a polyphthalamide (PPA) and/or a liquid crystal polymer (LCP)) and the reflective material additive may be, for example, glass, titanium dioxide ($TiO_2$) and/or barium sulfate ($BaSO_4$). An example of a PPA material one is available under the trade name Amodel™.

Each of the substrates 110 includes a semiconductor light emitting device receiving chamber (cavity) 112. A semiconductor light emitting device 114 is positioned in each of the receiving cavities 112. The light emitting devices 114 are electrically connected to leads 133 defined by the lead frame 105 that extend through the substrates 110 to the receiving chambers 112. As seen in FIG. 1 and FIG. 2, the light emitting device (LED) 114 is electrically connected by a bond wire 115 on one end thereof. A second connection may be provided to the LED 114 by a contact on the bottom surface thereof and/or by another bond wire 115. The leads 133 may include a contact portion 117 (FIG. 2) thereon in the cavity 112 to which the bond wire 115 or other electrical connection may be made.

The semiconductor light emitting device(s) 114 can comprise a light emitting diode, laser diode and/or other device which may include one or more semiconductor layers, which may comprise silicon, silicon carbide, gallium nitride and/or other semiconductor materials, a substrate which may comprise sapphire, silicon, silicon carbide, gallium nitride or other microelectronic substrates, and one or more contact layers which may comprise metal and/or other conductive layers. The design and fabrication of semiconductor light emitting devices are well known to those having skill in the art.

For example, the light emitting device(s) 114 may be gallium nitride based LEDs or lasers fabricated on a silicon carbide substrate such as those devices manufactured and sold by Cree, Inc. of Durham, N.C. For example, the present invention may be suitable for use with LEDs and/or lasers as described in U.S. Pat. Nos. 6,201,262, 6,187,606, 6,120,600, 5,912,477, 5,739,554, 5,631,190, 5,604,135, 5,523,589, 5,416,342, 5,393,993, 5,338,944, 5,210,051, 5,027,168, 5,027,168, 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor. Furthermore, phosphor coated LEDs, such as those described in United States Patent Application No. US 2004/0056260 A1, published on Mar. 25, 2004, entitled Phosphor-Coated Light Emitting Diodes Including Tapered Sidewalls, and Fabrication Methods Therefor, the disclosure of which is incorporated by reference herein as if set forth fully, may also be suitable for use in embodiments of the present invention.

The LEDs and/or lasers may be configured to operate such that light emission occurs through the silicon carbide substrate. In such embodiments, the silicon carbide substrate may be patterned so as to enhance light output of the devices as is described, for example, in the above-cited U.S. Patent Publication No. US 2002/0123164 A1.

In still other embodiments, a drop of a material such as epoxy that contains phosphor therein may be placed on the semiconductor light emitting device. LEDs that employ phosphor coatings are described, for example, in U.S. Pat. Nos., 6,252,254; 6,069,440; 5,858,278; 5,813,753; 5,277,840; and 5,959,316.

When the LEDs 114 and the respective bond wires 115 are installed in the cavity 112, to the LEDs 114 and the bond wires 115, a small amount of soft and transparent resin or the like may be applied in the cavity 112 and on the LEDs 114 and bond wires 115. As seen in FIGS. 1-3, a soft resin 131 is positioned between the LEDs 114 and bond wires 115 and an overlying lens material 125. The soft resin 131 may be, for example, silicone and may be a material selected to have a desired refractive index and physical properties. The soft resin 131 may be applied to the LEDs 114 so as to allow photons to exit from the LEDs 114 and enter into the soft resin 131, which may achieve enhanced light extraction efficiency in the finished semiconductor light emitting device. Furthermore, the soft resin 131 may not impart high shear and/or stress to the LEDs 114 as compared to a harder encapsulant, such as epoxy, during temperature cycling in use of the light emitting device, which can potentially damage the LEDs 114 and/or break their bond wires 115.

Figure 4:
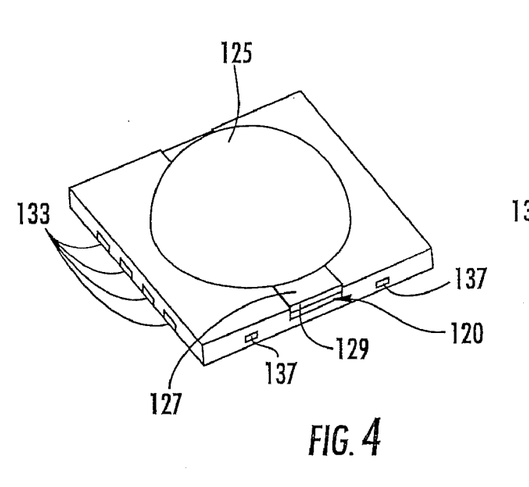
FIG. 4 is a perspective view of a packaged semiconductor light emitting device according to some embodiments of the present invention.

As further shown in FIGS. 1 and 3, a substrate strip 100 includes a passageway 120 extending between the receiving cavity 112 that is configured to direct the flow of resin between the respective receiving cavities 112. The lens material 125 covers each of the cavities 112 and includes a residual resin portion 127 extending through the passageways 120. As will be described further later herein, the residual resin portion 127 results from a liquid injection molding process used to form optical elements over each LED 114 from the lens material 125. A gate area or notched region 129 is shown in the residual resin portion 127 and may be used as a separation point when cutting the individual substrates 110 from the lead frame 105 to provide packaged semiconductor light emitting devices as illustrated in FIG. 4.

In some embodiments, the lens material 125 may be a resin used to encapsulate and form optical elements on the substrates 110 and may be of a higher durometer (harder) than the soft resin 131 that covers the LEDs 114 and bond wires 115. The lens material 125 may have high light transmissivity and a refractive index that matches that of the soft resin 131, such that minimal light will be reflected by total internal refraction (TIR). The molded optical element may also, in some embodiments, have a similar coefficient of thermal expansion (CTE) as the soft resin 131 and may bond well to contact surfaces of the plastic substrates 110.

Thus, the lens material 125 in some embodiments is a hard durometer material and has a refractive index substantially similar to a refractive index of the soft resin 131 to limit total internal reflection of the semiconductor light emitting device 114 and further may have a coefficient of thermal expansion substantially similar to a coefficient of thermal expansion of the soft resin 131. The high temperature plastic material used for the substrates 110 may be a higher durometer material than the lens material 125 and have a lower optical transmissivity than the lens material 125. Bonding surfaces 135 may be provided to facilitate adherence by the lens material 125 to surfaces of the substrates 110 as illustrated in the cross sectional view of FIG. 2.

The cross sectional view of FIG. 3 further illustrates a mounting portion 105' of the lead frame 105. During compression molding of the substrates 110, mounting portion 105' may be held in place in a tangential direction by the respective leads 133 and in the longitudinal direction by retaining tabs 137 seen in FIG. 4. The retaining tabs 137 are shown in FIG. 4 after cutting of the substrate 110 from the lead frame 105. The retaining tabs 137 may serve no electrical function and may be used merely to stabilize the mounting portion 105' during formation of semiconductor light emitting device packages.

Figure 5:
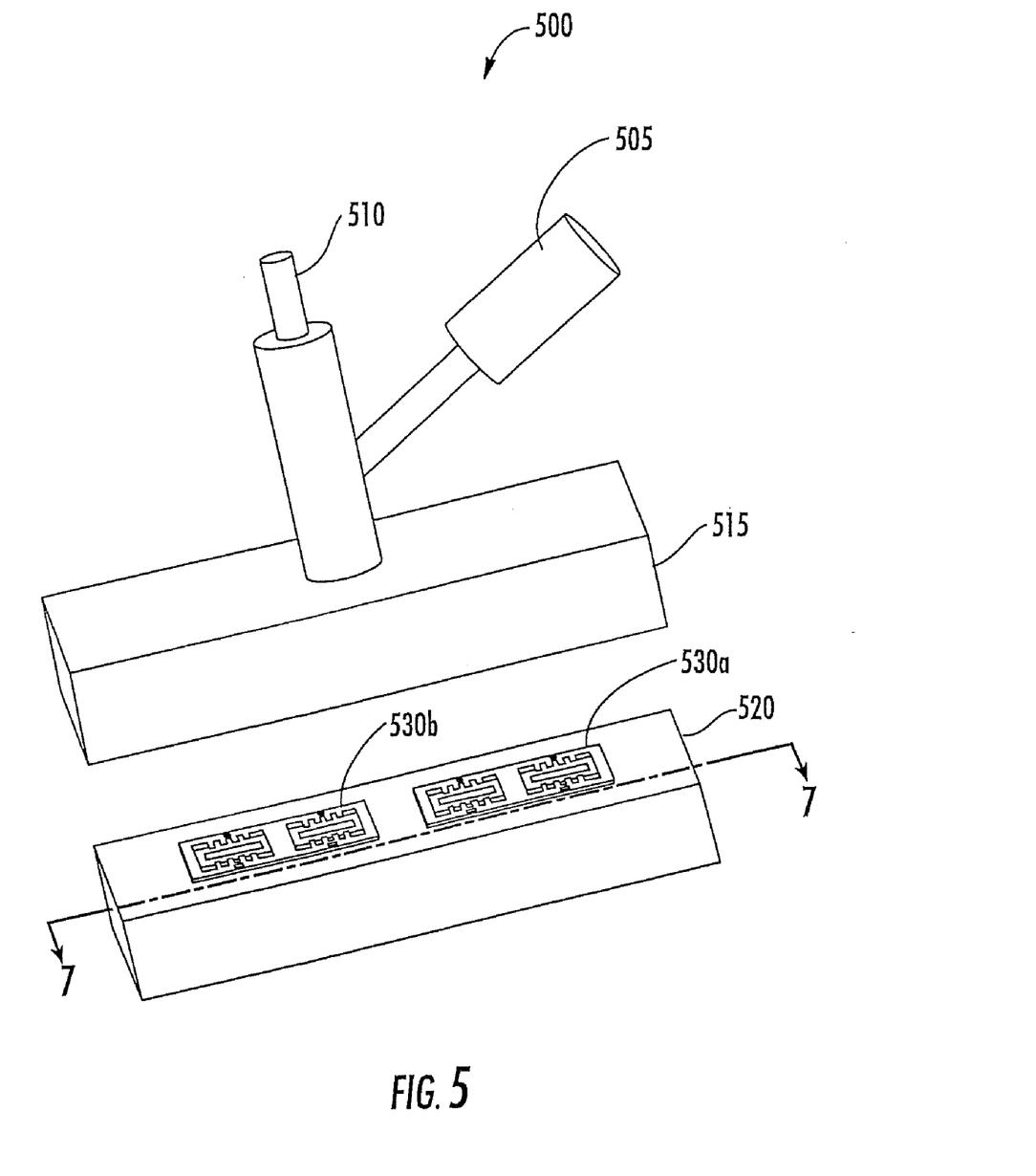
FIG. 5 is a perspective view of a mold with a plurality of substrate strips therein according to some embodiments of the present invention.
Figure 6A:
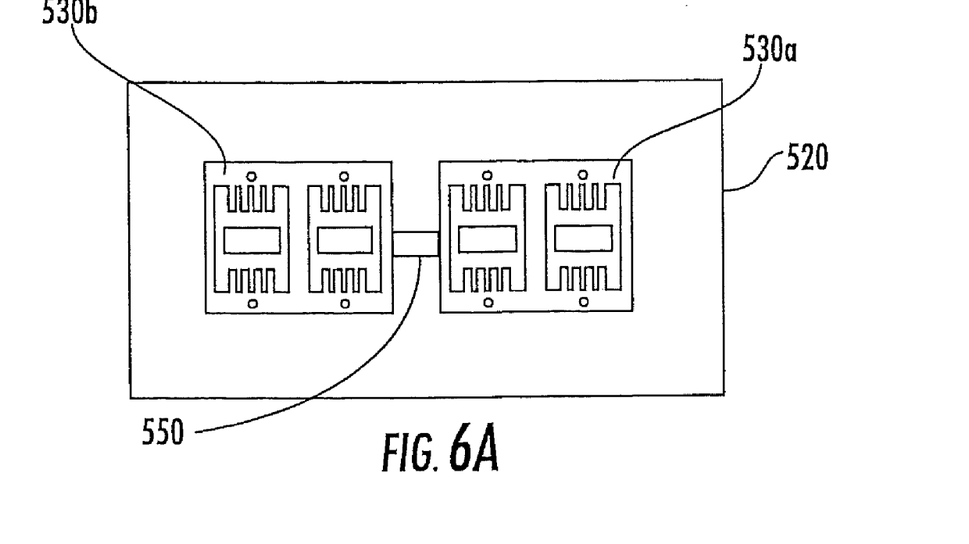
FIG. 6A is a plane view of the bottom half of the mold of FIG. 5 according to some embodiments of the present invention.
Figure 6B:
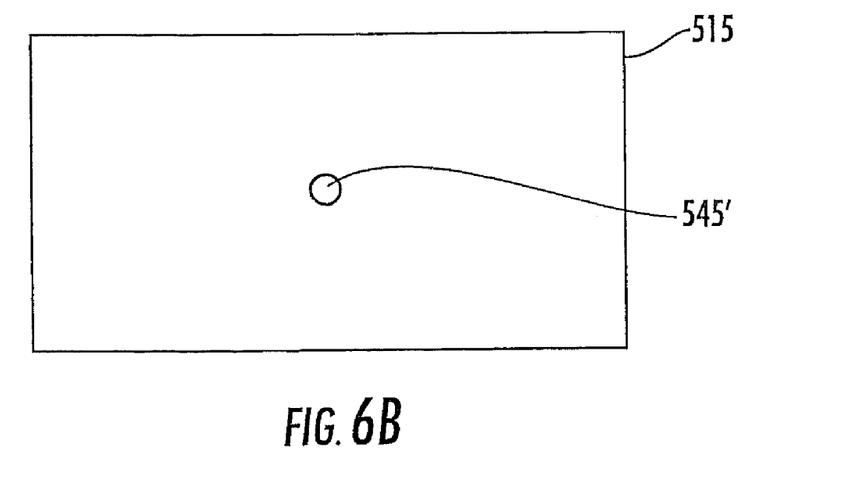
FIG. 6B is a plane view of the upper half of the mold of FIG. 5 according to some embodiments of the present invention.
Figure 7:
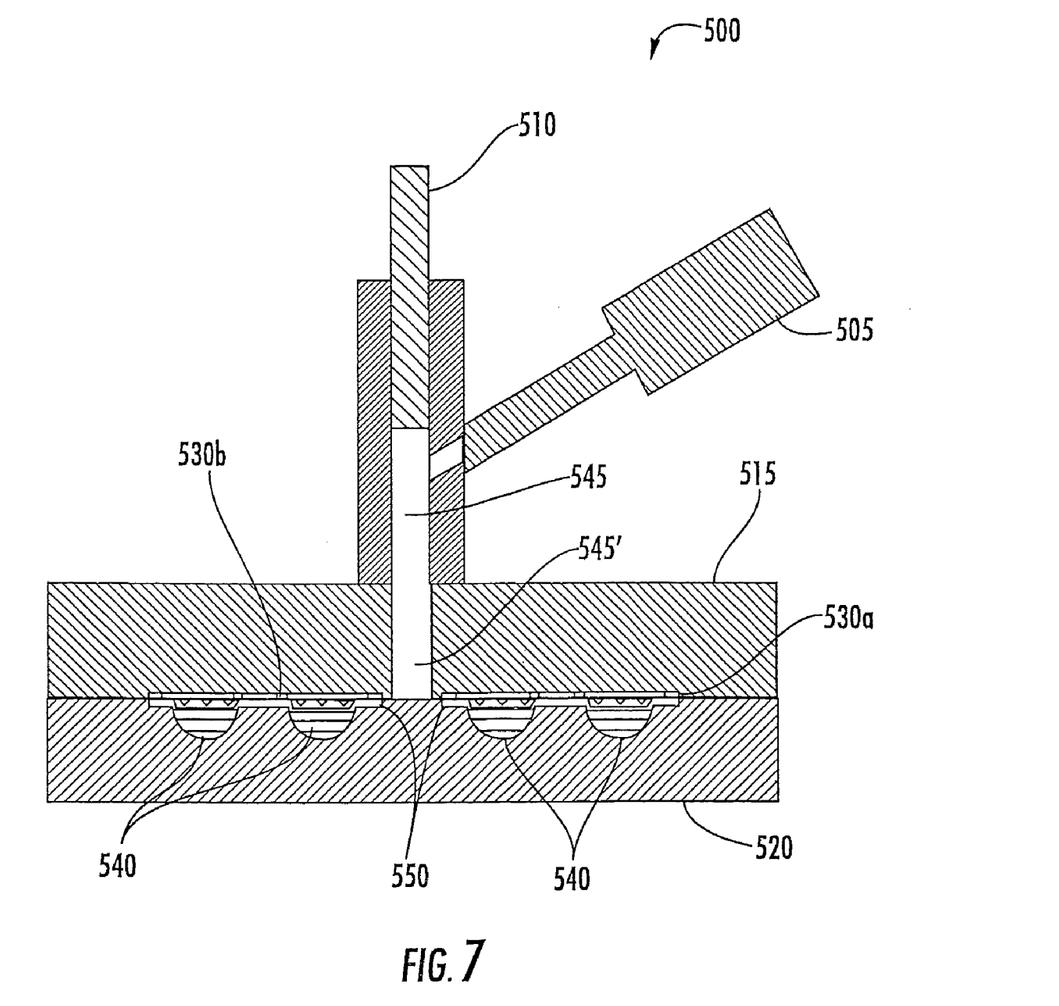
FIG. 7 is a cross sectional view of the mold of FIG. 5 taken along line 7-7 of FIG. 5.

A liquid injection mold suitable for use in fabricating a packaged semiconductor light emitting device according to some embodiments of the present invention will now be described with reference to FIGS. 5-7. FIG. 5 is a perspective view of a mold 500 with a plurality of substrate strips therein according to some embodiments of the present invention. FIG. 6A is a plane view of the bottom half of the mold of FIG. 5 according to some embodiments of the present invention. FIG. 6B is a plane view of the upper half of the mold of FIG. 5 according to some embodiments of the present invention. FIG. 7 is a cross sectional view of the mold of FIG. 5 taken along line 7-7 of FIG. 5.

As will be described herein, in some embodiments of the present invention a liquid injection encapsulating mold may include one or more cavities and can be equipped with a series of cavities to accommodate one or more strips of substrates so that a larger number of substrates can be molded in a single molding cycle. Inside a mold and around each unit of substrate placed therein, there may be a mold cavity with a desired optical shape for an injection molded lens or other optical element formed therein. The mold cavity may be filled with liquid resins during molding and may hold the resins over a molding period until the liquid resins transform themselves into a solid by a chemical reaction initiated by the heat of the mold as will be further described herein.

It will be understood that the characteristics of the resulting injection molded lens material 125 may be affected by various process conditions during liquid injection molding including, a mold temperature, injection pressure and speed, injector holding pressure and time for curing of the resin. In addition, applied vacuum may be used to assist removal of air from the mold cavity, which may minimize bubble formation during molding. Thus, during injection, the mold cavity may be completely sealed from atmosphere and vacuum may be used to assist removal of air from the mold cavity during molding to limit or even prevent bubble formation during molding.

As seen in FIGS. 5-7, the mold 500 includes an upper portion 515 and a lower portion 520. Two substrate strips 530A, 530B are shown in the bottom portion 520. As best seen in FIG. 7, a liquid metering and dispensing system 505 is coupled to a receiving chamber 545 of the mold 500. An injection plunger 510 is positioned proximate the receiving chamber 545 that may be activated to move the resin from the receiving chamber 545 into a mold cavity 540 while removing substantially all air from the mold cavity 540 to limit formation of air pockets in the resultant optical elements. As shown in the embodiments of FIG. 7 and in FIG. 6A, a passage 550 is provided at a bottom end 545' of the receiving chamber 545 through which resin may flow from the receiving chamber 545 into the mold cavities 540 and through the passageway 120 defined by the respective substrate strips 530A, 530B, and the bottom portion 520 of the mold 500. Resin may be injected by the plunger 510 from the receiving chamber 545 at a selected injection pressure and injection speed and the injected resin may be cured at a selected temperature and holding pressure for a selected time in the mold 500.

In some embodiments, at the start of each molding cycle, resin of a predetermined volume is metered and mixed, where the resin used is a thermoset plastic consisting of two constituents, a resin and a hardener, by a static mixer. The mixed resin, which now becomes chemically reactive within itself, is dispensed into the receiving chamber 545 of the mold 500. The injection plunger 510 is then activated to push the liquid resin into the mold cavity 540.

The mold 500, in some embodiments, may be used in a method of encapsulating and concurrently forming an optical element in a semiconductor light emitting device package that will serve to protect the semiconductor device and bond wires inside and to define the shape or luminous pattern for light exiting from the optical devices. Thus, in some embodiments of the present invention, an optical element may be molded and bonded on a substrate and may provide a robust and reliable package. More particularly, the injection molded optical element may be more robust and reliable than known prior art methods using pre-molded lenses that are attached by an adhesive, a process which may be inherently inconsistent and result in a less robust or reliable package. Thus, an optically designed element can be molded with liquid injection molding and the underlying substrate may provide structural surfaces to which the liquid resin may bond to produce a resultant robust and reliable package complete with its optical, element. Such packages may be used on higher power semiconductor light emitting device packages with a variety of different design lenses selected for a desired luminous pattern by appropriate design of the mold cavity 540.

In some embodiments of the present invention, depending upon the selected resin for the injection molding process, a mold temperature may be between about 100° C. and 200° C. In particular embodiments, the mold temperature is about 150° C. In some embodiments, a mold injection pressure may be between about 50 psi and 1000 psi. In some embodiments, the injection pressure is about 400 psi. An injection speed for the molding process may be selected based on a desired cycle time for the molding process, which may be about several seconds per cycle. The injection holding pressure during curing in some embodiments may be between about 50 psi and about 1000 psi, and in some embodiments, may be about 400 psi. The injection holding pressure during curing may be the same as the injection pressure used in injecting the resin. A selected cure time for the resin under the injection holding pressure may be selected based on productivity objectives constrained by potential coefficient of thermal expansion mismatch shrinkage effects from too rapid of a cure. The cure time may be affected by the selected cure temperature. In some embodiments, a cure time of no more than about 5 minutes is used.

Figure 8:
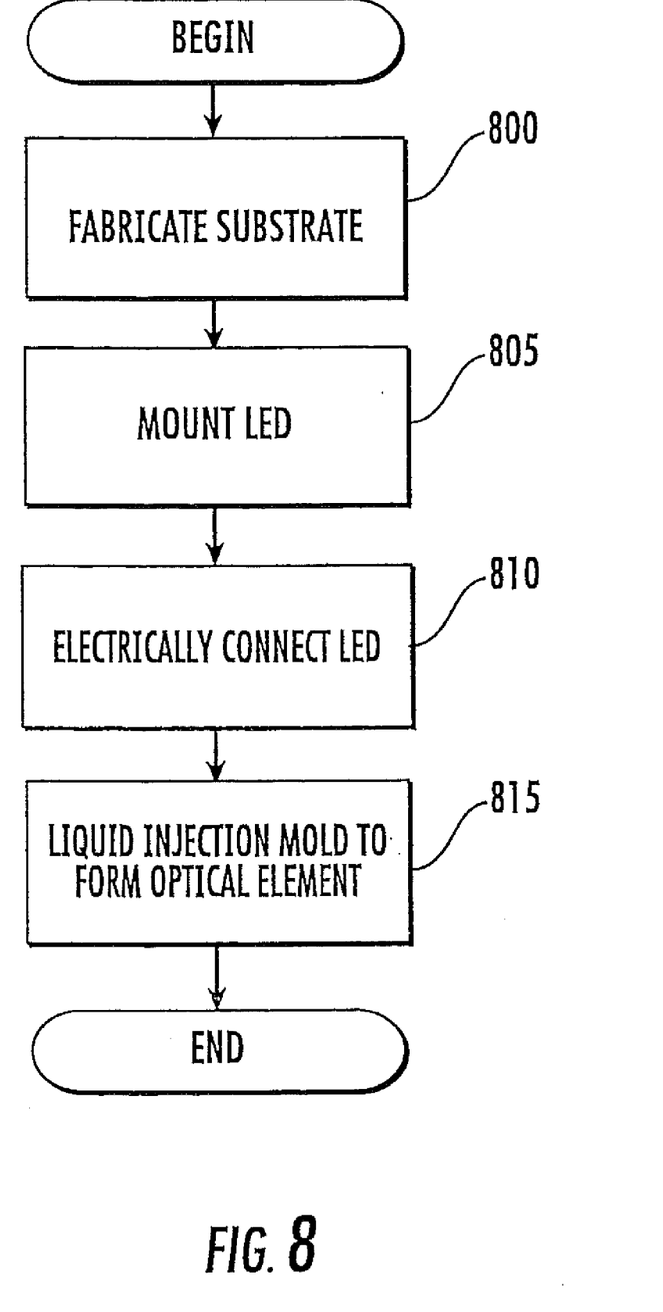
FIGS. 8 and 9 are flow charts illustrating operations for packaging a semiconductor light emitting device according to some embodiments of the present invention.

Semiconductor light emitting device packaging methods according to some embodiments of the present invention will now be further described with reference to the flowchart illustrations of FIGS. 8 and 9. Referring first to the embodiments of FIG. 8, operations begin with fabricating a substrate configured to mount a semiconductor light emitting device thereon (block 800). The substrate may include a cavity configured to mount the light emitting device therein. The semiconductor light emitting device is mounted in the cavity (block 805). The mounted semiconductor light emitting device is electrically connected to a contact portion of the substrate (block 810). The operations at block 805 for mounting the semiconductor light emitting device may concurrently make the electrical connection as described for operations at block 810, for example, with a flip-chip device. The substrate is liquid injection molded to form an optical element bonded to the substrate over the semiconductor light emitting device (block 815).

Semiconductor light emitting device packaging methods according to further embodiments of the present invention will now be described with reference to the flowchart illustration of FIG. 9. As seen in the embodiments of FIG. 9, operations begin by forming a metal base structure, such as a lead frame (block 900). For purposes of the description of the embodiments of FIG. 9, it will be assumed that the substrate that will be liquid injection molded is a substrate strip including a plurality of substrates, such as illustrated in FIG. 1. The formed metal base structure at block 900 may define resin bonding surfaces for a subsequently injection molded lens material, while the metal base structure may define the resin bonding surfaces where the contact with the lens material will be directly to the plastic material overmolded on the base structure rather than or in addition to direct contact on the underlying metal base structure.

The metal base structure is overmolded with a high temperature plastic material to define the plurality of substrates and to define a passageway that directs flow of the resin used in injection molding lens material between the respective plurality of substrates and into the plurality of cavities defined thereby during injection of the lens material (resin) (block 905). The high temperature plastic material may be a harder material than the material used for forming the optical element defined by the lens material and may have a lower optical transmissivity than the material used to form the optical element defined by the lens material.

As discussed above, the high temperature plastic material overmolded on the metal base structure at block 905 may include a reflective material additive. The high temperature plastic material may be a polyphthalamide (PPA) and/or a liquid crystal polymer (LCP) and the reflective material additive may be titanium dioxide ($TiO_2$) and/or barium sulfate ($BaSO_4$). The high temperature plastic material may be a higher durometer material than the injected resin used in forming the optical element and may have a lower optical transmissivity than the injected lens material.

The semiconductor light emitting device is mounted in the cavity (block 910). More particularly, for a substrate strip as used for purposes of the description of the embodiments of FIG. 9, a semiconductor light emitting device is mounted in each of the respective cavities at block 910. The mounted semiconductor light emitting devices are electrically connected (block 915). Electrically connecting the semiconductor light emitting device at block 915 may include wirebonding the respective semiconductor light emitting devices to a contact portion of the substrate strip with a bond wire.

Figure 9:
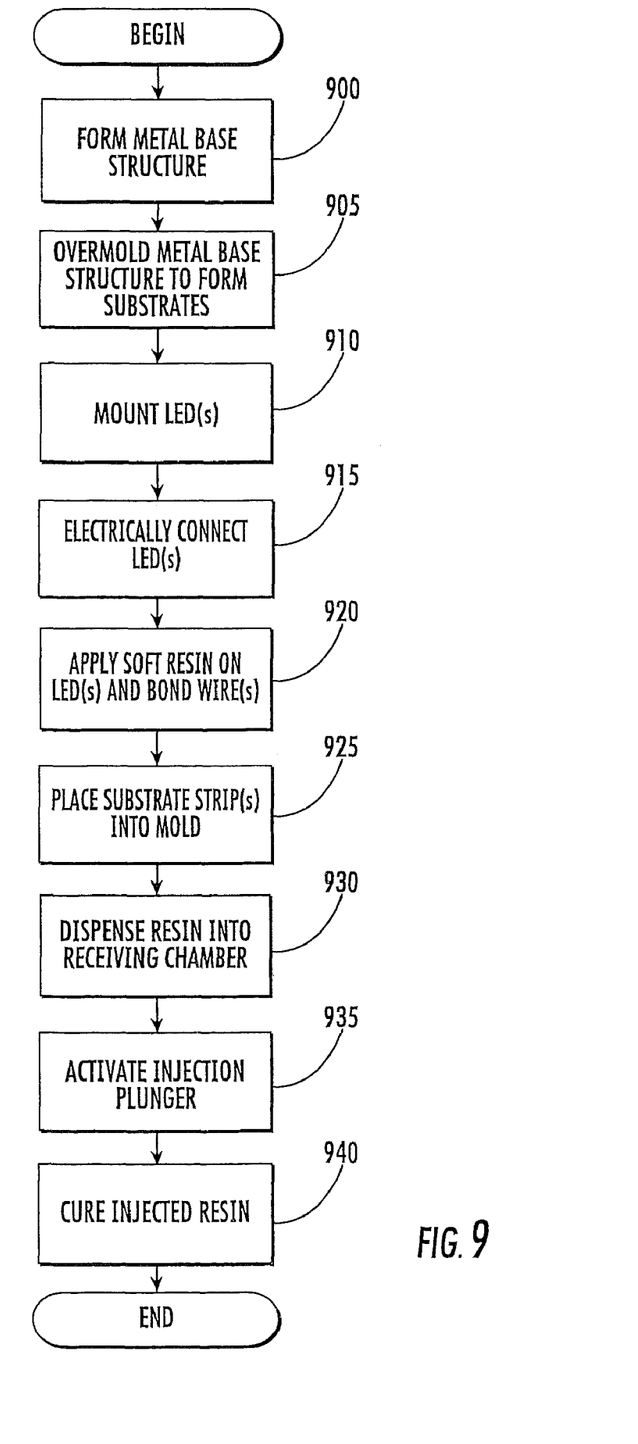

In some embodiments of the present invention as illustrated in FIG. 9, a soft resin is applied to the electrically connected semiconductor light emitting device mounted in the cavity (block 920). The soft resin may be applied so as to cover the semiconductor light emitting device and the bond wire in each respective cavity with the soft resin.

The substrate strip is placed in a mold having a mold cavity that has a shape that defines the desired optical element to be formed over the light emitting device on the substrate (block 925). The mold cavity may include a plurality of cavities, respective ones of which define the optical element for corresponding ones of the substrates on the substrate strip. Furthermore, as seen in FIG. 5, the mold may be configured to receive a plurality of the substrate strips and placing the substrate strip in the mold at block 925 may include placing a plurality of substrate strips in the mold for each injection molding cycle.

Operations related to injecting resin into the mold will now be described with reference to blocks 930 and 935. As shown at block 930, resin to be injected into the mold is dispensed into a receiving chamber of the mold. As described previously, the resin may be a thermoset resin including multiple components that may be mixed to activate the thermoset resin before dispensing the resin into the receiving chamber at block 930. As such, injecting the resin into the receiving chamber at block 930 may be preceded by metering and mixing a hardener into the resin. An injection plunger of the mold is activated to move the resin from the receiving chamber into the mold cavity while removing substantially all air from the mold cavity to limit formation of air pockets in the resultant optical elements (block 935). Note that the mold cavity may be vented or a vacuum may be applied during injection operations at block 935. Operations at block 935 may include flowing the resin through the passageway defined by the substrates and bottom mold portion and into contact with a high temperature plastic material of the substrates on the resin bonding surfaces. The injected resin is cured to form the optical elements bonded to the respective substrates (block 940).

The vacuum may be applied at block 935 to provide a vacuum effect after the mold portions (halves) are closed to evacuate gas or air from the space formed by the mold halves, such that no voids or air may be trapped inside the resin. Curing of the resin may subsequently occur at block 940 following evacuation of gas or air from the space formed by the mold halves, which curing may take place under selected pressure and/or temperature conditions.

In some embodiments of the present invention, the soft resin is silicone. The injected resin may be a higher durometer material and have a refractive index substantially similar to the refractive index of the soft resin to limit total internal reflection of the semiconductor light emitting device. The injected resin may have a coefficient of thermal expansion substantially similar to a coefficient of thermal expansion of the soft resin.

In some embodiments of the present invention methods provide direct encapsulation and molding of an optical element on an LED substrate by compression molding. Such methods may provide a reliable sealed LED packaged with a designed optical element, such as a lens, using a clear and transmitting encapsulant material, such as silicone. The methods may be used for forming an LED package in PCT (printed circuit board) or LF (leadframe) format as they normally populated with many units in high density. As such the mold may be small and the output may be high.

Operations may begin with the substrate first precisely located and held by vacuum against a top mold die surface. A resin is then placed on the bottom mold die surface. Where the resin is presented in liquid form, it may first be metered, mixed (if two-part resin is used) and dispensed onto a top surface of the bottom mold by a metering/mixing/dispensing system of the molding machine. Where resin is presented in a solid power form, its predetermined amount (by weight) may be spread and deposited on the bottom mold die surface. The resin will generally quickly turn into liquid due to a high temperature (such as 150° C. or above) of the mold bottom die.

The top mold platen may be slowly closed onto the bottom mold platen at a selected/programmed speed. Before the two mold platens close completely, the top mold platen may compress a silicon O-ring of the bottom mold platen. The O-ring seal may be located at a peripheral region of the mold platen, such that when compressed by the two matching mold platen, it may form a substantially air-tight seal to the space between the two platens. The top mold platen may stop at this position for several seconds while a vacuum is applied to the chamber to evacuate air from both the mold cavities and the molding resin. Evacuation of air from mold cavities and resin may be used to produce an encapsulated package substantially free of air bubbles, as air bubbles may adversely affect the reliability of the product.

The top mold platen may be finally closed and held in position to allow the resin to cure. Some excess resin may be squeezed out of the mold cavities into space outside mold die within the enclosed space of the mold platens. At the end of a molding cycle, when the resin is cured, the top mold platen may be opened and the molded substrate may be removed from the top mold die surface.

Extracting molded portion of the package from the substrate may present some challenges. Methods commonly used to facilitate ejection of a molded part from a mold cavity include use of specularly polished hard-chrome plated tool-steel material on the mold cavity. Other methods include use of positive ejecting system, such as a pin or plastic film, to aid in ejecting a part from the bottom mold cavities.

As such, some embodiments of the present invention using compression molding of the optical element may form to a completed package body better than potting used, for example, with some through-hole LED packages, such as 5 mm lamps. Reduced air trapping and bubble formation may be provided as contrasted with transfer molding approaches (e.g., due to the absence of a runner system, a compression mold process as described for some embodiments may produce high quality encapsulation at a much lower cost than transfer molded parts). Greater consistency and lower costs may be provided as contrasted with use of a premolded lens that is attached by an adhesive and/or by heatstaking. Better consistency and higher yields may be provided relative to "Glop top" dispensing of a viscous resin to form a meniscus and letting it cure to form the optical element of a selected shape (As the resin is generally a thermoset plastic, such as silicone, and it normally requires additional exposure to high temperature for added time to complete cross-linking, after the substrate is removed from the mold, it is generally post cured in, for example, a belt oven.)

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A semiconductor light emitting device substrate strip, comprising:
   a metal base structure;
   a plurality of high temperature plastic material substrates on the metal base structure, the substrates including semiconductor light emitting device receiving cavities; and
   a passageway extending between the receiving cavities configured to direct a flow of resin between the respective receiving cavities.

2. The substrate strip of claim 1, wherein the high temperature plastic material includes a reflective material additive.

3. The substrate strip of claim 2, wherein the high temperature plastic material comprises a polyphthalamide (PPA) and/or a liquid crystal polymer (LCP) and wherein the reflective material additive comprises titanium dioxide ($TiO_2$) and/or barium sulfate ($BaSO_4$).

4. The substrate strip of claim 1, further comprising:
   a semiconductor light emitting device positioned in each of the receiving cavities; and
   a lens material covering each of the receiving cavities and including a residual resin portion extending through the passageway.

5. The substrate strip of claim 4, wherein the semiconductor light emitting devices are electrically connected to leads defined by the metal base structure that extend through the substrates to the receiving cavities.

6. The substrate strip of claim 5, wherein the light emitting devices are electrically connected by bond wires and wherein the substrate strip further comprises a soft resin between the semiconductor light emitting devices and the bond wires and the lens material.

7. The substrate strip of claim 6, wherein the soft resin comprises silicone.

8. The substrate strip of claim 6, wherein the lens material comprises a higher durometer material than the soft resin, has a refractive index substantially similar to a refractive index of the soft resin to limit total internal reflection of the semiconductor light emitting device, and has a coefficient of thermal expansion substantially similar to a coefficient of thermal expansion of the soft resin.

9. The substrate strip of claim 4, wherein the high temperature plastic material comprises a higher durometer material than the lens material and has a lower optical transmissivity than the lens material.

10. The substrate strip of claim 9, wherein the high temperature plastic material comprises a polyphthalamide (PPA) and/or a liquid crystal polymer (LCP) and wherein the lens material comprises a thermoset resin.

11. The substrate strip of claim 4, wherein the plurality of high temperature plastic material substrates are overmolded on the metal base structure.

12. The substrate strip of claim 1 wherein the metal base structure is a lead frame.

* * * * *